(12) United States Patent
Kim et al.

(10) Patent No.: US 8,384,056 B2
(45) Date of Patent: Feb. 26, 2013

(54) PHASE CHANGE RANDOM ACCESS MEMORY DEVICE AND METHOD OF MANUFACTURING THE SAME

(75) Inventors: Min Seok Kim, Gyeonggi-do (KR); Hyo Seob Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 62 days.

(21) Appl. No.: 12/839,465

(22) Filed: Jul. 20, 2010

(65) Prior Publication Data
US 2011/0073830 A1    Mar. 31, 2011

(30) Foreign Application Priority Data
Sep. 30, 2009    (KR) .................. 10-2009-0093616

(51) Int. Cl.
*H01L 29/02* (2006.01)
(52) U.S. Cl. .................. 257/2; 257/4; 257/E45.002
(58) Field of Classification Search .................. 257/2–5, 257/379, E45.002
See application file for complete search history.

(56) References Cited

U.S. PATENT DOCUMENTS
8,049,199 B2 * 11/2011 Eun et al. .................. 257/4

FOREIGN PATENT DOCUMENTS
| KR | 1020060001096 A | 1/2006 |
| KR | 1020060042314 A | 5/2006 |
| KR | 1020060094424 A | 8/2006 |
| KR | 1020090081848 A | 7/2009 |

* cited by examiner

*Primary Examiner* — Jack Chen
(74) *Attorney, Agent, or Firm* — Ladas & Parry LLP

(57) ABSTRACT

A phase change random access memory includes a semiconductor substrate, a switching device pattern formed on the semiconductor substrate, a bottom electrode contact pattern formed on the switching device pattern, a phase change layer pattern formed on the bottom electrode contact pattern, and an insulating layer disposed at a portion of an contact surface between the bottom electrode contact pattern and the phase change layer pattern.

5 Claims, 2 Drawing Sheets

PHASE CHANGE RANDOM ACCESS MEMORY DEVICE AND METHOD OF MANUFACTURING THE SAME

CROSS-REFERENCES TO RELATED APPLICATION

This application claims priority under 35 U.S.C. 119(a) to Korean application number 10-2009-0093616, filed on Sep. 30, 2009, in the Korean Patent Office, which is incorporated by reference in its entirety as if set forth in full.

BACKGROUND

1. Technical Field

The inventive concept relates generally to a phase change random access memory device and a method of manufacturing the same and, more particularly, to a phase change random access memory device with a bottom electrode and a method of manufacturing the same.

2. Related Art

Phase-change Random Access Memories (PCRAMs) are memory devices for reading and programming information by changing the state of a phase change materials between a high resistance amorphous state and low resistance crystalline state. PCRAMs offer high operation speeds and high integration degrees. PCRAMs use chalcogenide (GST)-based material which is comprised of germanium (Ge), antimony (Sb) and tellurium (Te) as the phase change material. The chalcogenide is phase-changed between the crystalline state of low resistance, which is a SET state, and the amorphous state of high resistance, which is a RESET state, according to an applied current that is, Joule heat. Whether the stored information is the data "0" of the SET state or the data of "1" of the RESET state is determined by sensing the current flowing through the phase change layer in program and read modes.

Typically, a transistor was used in a conventional PCRAM as a cell switch. Recently, a vertical diode has been investigated for use as a cell switch in an attempt to improve the integration degree and increase the operation current.

A bottom electrode contact (BEC) serves as a heater applying heat to the phase change material in a PCRAM. The large contact resistance between the BEC and the phase change layer on the BEC can maximize the reset current characteristic.

To maximize the reset current characteristic, it is necessary to fabricate the BEC having a diameter of below 40 nm. However, it is difficult to fabricate a contact hole of such a fine diameter by a current lithography apparatus and techniques. Furthermore, if the line width of the BEC is decreased through a double photo lithography process, the area contacted with the phase change layer can reduced so as to ensure the reset current characteristic. However, this reduces the area contacted with the cell switch, and therefore the current transfer characteristic is degraded.

SUMMARY

According to one aspect of an exemplary embodiment, a phase change random access memory device includes a semiconductor substrate, a switching device pattern formed on the semiconductor substrate, a bottom electrode contact pattern formed the switching device pattern, a phase change layer pattern formed on the bottom electrode contact pattern and an insulating layer disposed at a portion of the contact surface between the bottom electrode contact pattern and the phase change layer pattern.

According to another aspect of another exemplary embodiment, a method of manufacturing a phase change random access memory device includes forming a bottom electrode contact pattern on a semiconductor substrate which a switching device pattern is formed on, forming an insulating layer on a portion of the bottom electrode contact pattern and forming a phase change layer pattern on the bottom electrode contact pattern and the insulating layer.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
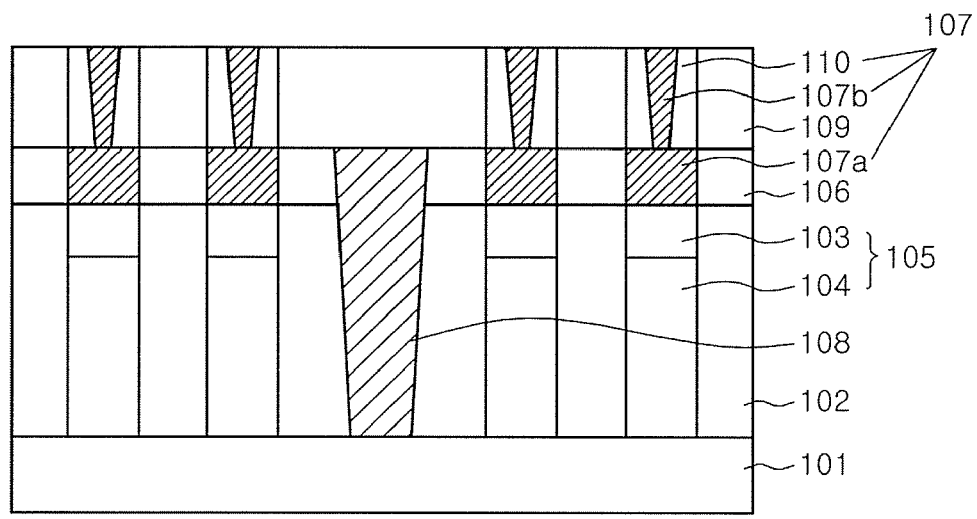
FIGS. 1 through 4 are cross-sectional views shown for illustrating a method of manufacturing a phase change random access memory device according to an exemplary embodiment of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 4 are cross-sectional views shown for illustrating a phase change random access memory device according to an exemplary embodiment of the inventive concept.

Referring to FIG. 1, a bottom electrode contact pattern 107 is formed on a semiconductor substrate 101. First, a N-type high concentration impurity region (not shown) is formed in the semiconductor substrate 101. A first interlayer insulating layer 102 is formed on the semiconductor substrate 101 which the N-type high concentration impurity region is formed on. The first interlayer insulating layer 102 may comprises a high density plasma (HDP) layer which has a high density film property and an interlayer planarization property. A PN diode pattern 105 is comprised of an N-type layer 104 and a P-type layer 103 and is formed in the first interlayer insulating layer 102. If a word line comprises a junction type word line, the PN diode pattern 105 may be formed by a selective epitaxial growth (SEG) method. If a word line comprises a metal word line, the PN diode pattern 105 may be formed of a poly diode.

A second interlayer insulating layer 106 is formed on the PN diode pattern 105 and the first interlayer insulating layer 102. A bottom layer 107a for a bottom electrode is formed selectively within the second interlayer insulating layer 106, for example at positions corresponding to the PN diode patterns. The bottom layer 107a for a bottom electrode may comprise a TiN-based conductive layer. As described above, if a metal word line (not shown) is used, the first and second interlayer insulating layers 102 and 106 may be etched to form a metal wiring 108 for connecting the metal word line, but it is not limited thereto. A third interlayer insulating layer 109 is formed on a resultant structure of the second interlayer insulating layer 106. A top layer 107b for a bottom electrode is formed within the third interlayer insulating layer 109 and is surrounded by a spacer 110. The third interlayer insulating layer 109 may comprise a nitride layer exhibiting excellent heat endurance characteristics and the spacer 110 may comprise any insulating material. The spacer 110 may comprise a nitride layer as well as an oxide layer. Accordingly, as shown in FIG. 1, a self-aligned bottom electrode contact pattern 107 comprised of the bottom layer 107a for a bottom electrode, the top layer 107b for a bottom electrode, and the spacer 110, is formed.

According to an embodiment, the structure of the bottom electrode contact pattern 107 may be controlled such that the bottom contact area and the top contact area are substantially different from each other. That is, the bottom electrode contact pattern 107 has a double structure where an area contacted with the PN diode pattern 105 is wider than an area substantially contacted with the phase change layer (not shown).

In detail, the bottom layer 107a for a bottom electrode may be formed to have substantially the same area as an upper sectional dimension of the PN diode pattern 105 so that the contact area between the bottom layer 107a for a bottom electrode of the bottom electrode contact pattern 107 and the PN diode pattern 105 is substantially equal to the upper sectional dimension of the PN diode pattern 105. However, the top layer 107b for a bottom electrode of the bottom electrode contact pattern 107 which is substantially contacted with the phase change layer (not shown) and heated is defined as an region exposed by the spacer 110 so that it may be formed to be smaller than the sectional dimension of the bottom layer 107a for a bottom electrode. Accordingly, the bottom electrode pattern 107 of a double structure having different sectional dimensions can satisfy the condition that a bottom contact area has low electrical resistance and an upper contact area has high electrical resistance.

Furthermore, the bottom layer 107a for a bottom electrode and the top layer 107b for a bottom electrode may comprise the same material. That is, the bottom and top layers 107a and 107b for a bottom electrode may be comprised of the same Ti-based material or the same TiN-based material. However, the present invention is not limited in this regard and the bottom and top layers 107a and 107b for a bottom electrode may alternatively be formed to have different resistance. For example, the bottom electrode contact pattern 107 may be formed of dual layers having different resistance. That is, for example, the bottom electrode contact pattern 107 may be formed so that the top layer 107b for a bottom electrode has a resistivity larger than the bottom layer 107a for a bottom electrode thereby improving the electric characteristics of the device.

Figure 2:
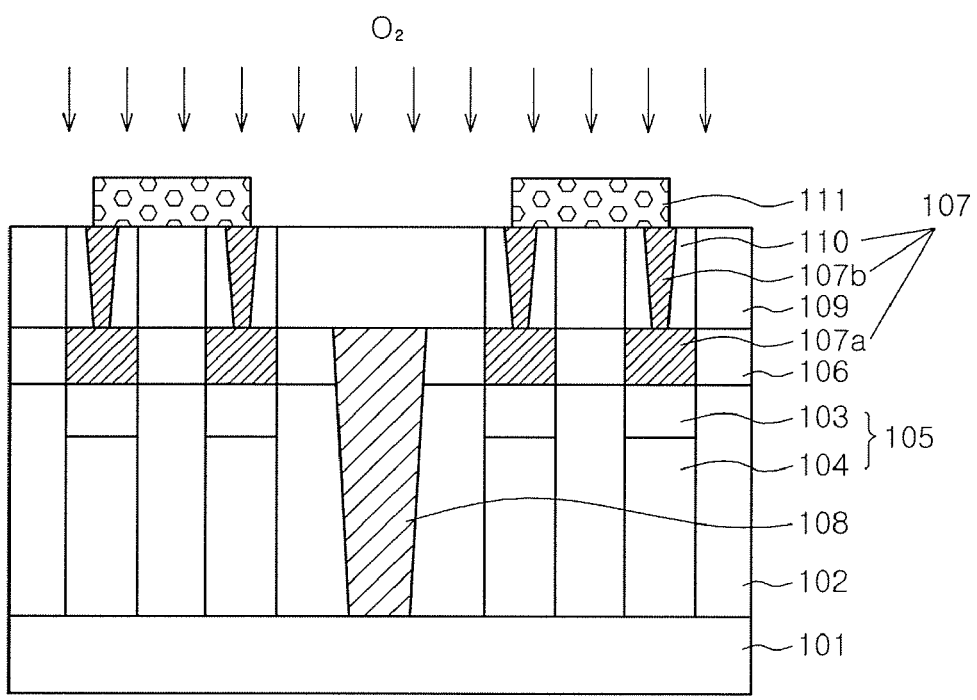

Referring to FIG. 2, a photoresist pattern 111 is formed on a resultant structure of FIG. 1 and an exposed portion of the resultant structure is oxidized. Conventionally, after the bottom electrode contact pattern is formed, the phase change material is consecutively deposited to form the phase change layer (not shown). In contrast, in the exemplary embodiment, a photoresist material is coated on the bottom electrode contact pattern 107 and is patterned before the phase change layer (not shown) is formed. In detail, the photoresist pattern 111 is formed on a portion of the top layer 107b for a bottom electrode, the spacer 110, and the third interlayer insulating layer 109, such that a portion of an upper surface of the top layer 107b for a bottom electrode is exposed therethrough. Accordingly, during the oxidation, the exposed portion of the upper surface of the top layer 107b for a bottom electrode is oxidized.

In detail, the photoresist pattern 111 may be formed by coating a photoresist layer (not shown) on the third interlayer insulating layer 109, the spacers, and the top electrode 107b for a bottom electrode, and carrying out an expose and development process. At this time, the photoresist is patterned to expose a portion of the bottom electrode contact pattern 107, for example one side edge of the upper surface of the bottom electrode contact pattern 107. Specifically, when the top layer 107b for a bottom electrode of the bottom electrode contact pattern 107 is formed, it is significant to expose the portion of the top layer 107 for a bottom electrode. Accordingly, the photoresist pattern 111 is formed so that the exposed portion of the bottom electrode contact pattern 107 is below 50% of the upper sectional dimension of the bottom electrode contact pattern 107.

As shown in FIG. 2, one photoresist pattern 111 is formed over two adjacent bottom electrode contact patterns 107, and as therefore the width of an opening between two adjacent photoresist patterns 111 may be greater than a width of an opening between two adjacent bottom electrode contact patterns 107. Due to this, the photoresist pattern 111 is freely formed from the limit of the fine process than the bottom electrode contact pattern 107. For example, the horizontal space of the opening between adjacent photo mask patterns 208 may be 50 nm, but it is not limited thereto.

Subsequently, a dry or wet oxidizing process is carried out using the photoresist pattern 111 as an oxidation mask. For example, a dry oxidation process may be carried out to oxidize the upper TiN material of the bottom electrode contact pattern 107 using $O_2$ gas of predetermined amount. Alternatively, a wet oxidizing process may be carried out by applying an oxidation solution causing an oxidation reaction.

Figure 3:
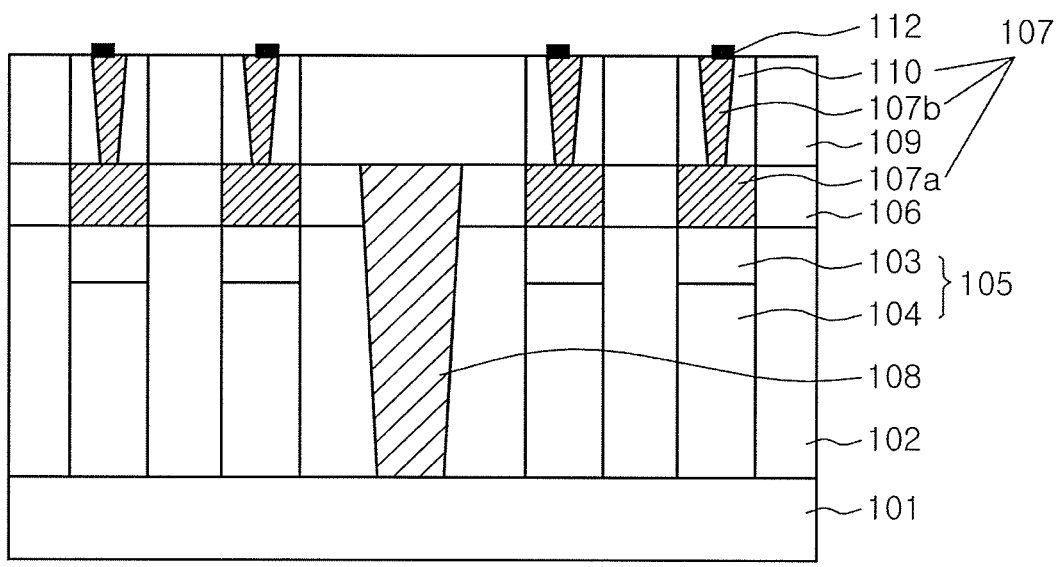

Referring to FIG. 3, an oxide layer 112 is formed on a portion of the bottom electrode contact pattern 107 through the process of FIG. 2. The oxide layer 112 is an insulator and is electrically insulated.

As shown in FIG. 3, due to the presence of the photoresist pattern 111, an oxidation reaction is caused at the exposed portion of the bottom electrode contact pattern 107 to form the oxide layer 112, and the portion of the bottom electrode contact pattern 107 which is covered by the photoresist pattern 111 is not oxidized. In particular, an oxidation reaction is actively caused at the exposed upper portion of the TiN material of the bottom electrode contact pattern 107 to form the oxide layer 112. However, an oxidation reaction is substantially not occurred at the exposed nitride material of the spacer 110, such that the oxide layer 112 is not formed on the spacer 110. Herein, whether or not the oxide layer 112 is formed on the spacer 110 is not significant, as the addition of the oxide layer 112 would not affect an insulating property of the spacer 110, which is an insulator. However, that the formation of the oxide layer 112 on the top layer 107b for a bottom electrode is significant as the top layer 107b for a bottom electrode is a conductive layer. Accordingly, an electrically insulated area in the top layer 107b for a bottom electrode in the exemplary embodiment may be increased more than the conventional bottom electrode.

Figure 4:
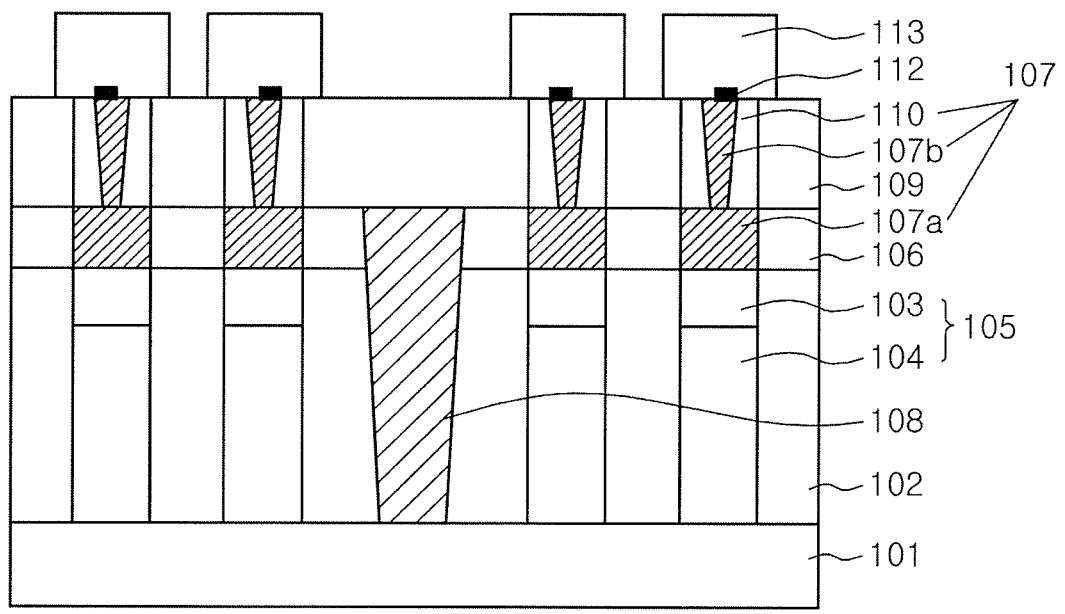

Referring to FIG. 4, a phase change layer pattern 113 is formed on a resultant structure of FIG. 3.

A phase change material layer (not shown) is deposited on the resultant structure of FIG. 3 and then patterned to form the phase change layer pattern 113 as shown in FIG. 4.

As clearly shown in FIG. 4, the contact area between the phase change layer pattern 113 and the upper surface of the bottom electrode contact pattern 107 is reduced more than the conventional art. That is, the heating area of the phase change layer pattern 113 is reduced to be less than the upper surface dimension of the top layer 107b for a bottom electrode due to the oxide layer 112, which is formed on the bottom electrode contact pattern 107. Accordingly, the contact area between the top layer 107b for a bottom electrode of the bottom electrode contact pattern 107 and the phase change layer pattern 113 formed thereon is reduced, and the contact resistance is increased thereby improving the device operation.

According to the exemplary embodiment, the oxide layer 112 is disposed at a portion of the contact surface between the bottom electrode contact pattern 107 and the phase change layer pattern 113 so as to reduce a heating sectional dimension of the phase change layer pattern 113 to be smaller than the upper surface dimension of the top layer 107b for a bottom electrode.

As described, the degree that the oxide layer 112 covers the bottom electrode contact pattern 107 may be varied according to electrical properties of the device and contact stability.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A phase change random access memory device, comprising:
    a semiconductor substrate;
    a switching device pattern formed on the semiconductor substrate;
    a bottom electrode contact pattern formed on the switching device pattern;
    a phase change layer pattern formed on the bottom electrode contact pattern; and
    an insulating layer disposed to project into the phase change layer at a portion of a contact surface between the bottom electrode contact pattern and the phase change layer pattern.

2. The phase change random access memory device of claim 1, wherein the bottom electrode contact pattern comprises a bottom electrode, the bottom electrode comprising:
    a bottom layer contacted with the switching device pattern; and
    a top layer contacted with phase change layer pattern.

3. The phase change random access memory device of claim 2, wherein the insulating layer is formed on a portion of the top layer of the bottom electrode.

4. The phase change random access memory device of claim 2, wherein a sectional dimension of the bottom layer of the bottom electrode is greater than that of the top layer of the bottom electrode.

5. The phase change random access memory device of claim 2, wherein the bottom electrode further comprises a spacer surrounding the top layer of the bottom electrode.

* * * * *